(12) United States Patent
Li et al.

(10) Patent No.: US 10,913,045 B2
(45) Date of Patent: Feb. 9, 2021

(54) POROUS MICROSPHERE AND METHOD FOR PREPARING THE SAME

(71) Applicant: National Taipei University of Technology, Taipei (TW)

(72) Inventors: Chia-Chen Li, Taipei (TW); Jia-Hao Jhang, Taipei (TW)

(73) Assignee: National Taipei University of Technology, Taipei (TW)

( * ) Notice: Subject to any disclaimer, the term of this patent is extended or adjusted under 35 U.S.C. 154(b) by 205 days.

(21) Appl. No.: 16/129,791

(22) Filed: Sep. 12, 2018

(65) Prior Publication Data

US 2019/0374922 A1 Dec. 12, 2019

(30) Foreign Application Priority Data

Jun. 7, 2018 (TW) .............................. 107119732 A

(51) Int. Cl.
*B01J 13/12* (2006.01)
*B01J 13/20* (2006.01)
*H01L 51/42* (2006.01)
*H01G 9/20* (2006.01)

(52) U.S. Cl.
CPC .............. *B01J 13/125* (2013.01); *B01J 13/20* (2013.01); *H01G 9/2059* (2013.01); *H01L 51/426* (2013.01)

(58) Field of Classification Search
CPC ........... B01J 13/20; C08L 25/00; C08L 25/02; C08L 25/08
See application file for complete search history.

(56) References Cited

U.S. PATENT DOCUMENTS

| 4,384,095 A | 5/1983 | Reed et al. |
| 5,380,619 A * | 1/1995 | Timmerman ......... C08F 230/02 430/213 |
| 2003/0091824 A1* | 5/2003 | Kim ...................... C08L 51/10 428/404 |

FOREIGN PATENT DOCUMENTS

| CN | 1636943 | 7/2005 |
| CN | 102029133 | 4/2011 |
| TW | 201718666 | 6/2017 |

OTHER PUBLICATIONS

Kwark, "Preparation of Branched Polystyrene Using Atom Transfer Radical Polymerization Techniques and Protection-Deprotection Chemistry," 2008, Macromolecular Research, vol. 16, No. 3, pp. 238-246. (Year: 2008).*

(Continued)

*Primary Examiner* — Robert A Vetere
(74) *Attorney, Agent, or Firm* — JCIPRNET

(57) ABSTRACT

A porous microsphere and a method for preparing the same includes the following steps. A copolymer having a vinylbenzyl chloride unit and a vinylbenzyl alcohol unit is dissolved in an organic solvent, and inorganic particles are dispersed in the organic solvent to form a mixed suspension. An aqueous solution containing a surfactant is provided. The mixed suspension is emulsified in the aqueous solution to form an emulsion. The emulsion is heated to evaporate the organic solvent to obtain inorganic-composite porous microspheres suspended in water. The copolymer in the formed porous microspheres can be further carbonized or removed to produce inorganic-based porous microspheres containing carbon or not containing carbon.

6 Claims, 5 Drawing Sheets

(56) References Cited

OTHER PUBLICATIONS

"Office Action of Taiwan Counterpart Application," dated Feb. 20, 2019, p. 1-p. 8.
Andre' R. Studart et al. "Processing Routes to Macroporous Ceramics: A Review," Journal of the American Ceramic Society, vol. 89, No. 6, Jun. 2006, pp. 1771-1789.
T. Ohji et al. "Macro porous ceramics: processing and properties," International Materials Reviews, vol. 57, No. 2, Nov. 12, 2013, pp. 115-131.
Ruiping Liu et al. "A review of fabrication strategies and applications of porous ceramics prepared by freeze-casting method," Ceramics International, vol. 42, Nov. 10, 2015, pp. 2907-2925.
Jung-Hye Eom et al. "Processing and properties of macroporous silicon carbide ceramics: A review," Journal of Asian Ceramic Societies 1, Jul. 31, 2013, pp. 220-242.
Fengqiu Tang et al. "Fabrication of Macroporous Alumina with Tailored Porosity," Journal of the American Ceramic Society, vol. 86, No. 12, Dec. 2003, pp. 2050-2054.
Bo Zhao et al. "Well-Defined Hierarchical Templates for Multimodal Porous Material Fabrication," Chemistry of Materials, vol. 22, No. 14, Jun. 22, 2010, pp. 4312-4319.
Jing Hu et al. "Fabrication and application of inorganic hollow spheres," Chemical Society Reviews, vol. 40, Jul. 29, 2011, pp. 5472-5491.
Hideo Nakajima. "Fabrication, properties and application of porous metals with directional pores," Progress in Materials Science, vol. 52, Sep. 2007, pp. 1091-1173.

\* cited by examiner

POROUS MICROSPHERE AND METHOD FOR PREPARING THE SAME

CROSS-REFERENCE TO RELATED APPLICATION

This application claims the priority benefit of Taiwan application serial no. 107119732, filed on Jun. 7, 2018. The entirety of the above-mentioned patent application is hereby incorporated by reference herein and made a part of this specification.

BACKGROUND OF THE INVENTION

Field of the Invention

The invention relates to a porous material containing inorganic substance, and more particularly, to an inorganic-composite porous microsphere and a method for preparing the same.

Description of Related Art

Currently, preparation of inorganic porous materials is achieved via methods such as template method, rubbing method, freeze casting, partial sintering, and direct foaming, but the steps are complex, the cost is high, a microsphere structure having a regular shape is not readily obtained, and the pore size is difficult to control. Moreover, the above methods are only suitable for manufacturing porous materials having small to medium pores (<50 nm), and macropores or megapores are not readily obtained. Moreover, a synthesis method in which a template is used or the sintering density is adjusted also limits the type of materials that can be used.

Moreover, titanium dioxide is a common inorganic material, and applications thereof include, for instance, photodegradation and dye-sensitized solar cell (DSSC). In the past, to perform photodegradation on titanium dioxide in visible light, expensive materials such as precious metal elements or graphene are added such that the cost is high. In a DSSC, since the conductivity of titanium dioxide is poor, there is the issue of reduced photoelectric conversion efficiency.

SUMMARY OF THE INVENTION

In view of the foregoing, the invention provides a method for preparing an inorganic-composite porous microsphere or an inorganic porous microsphere, and an inorganic-composite porous microsphere or an inorganic porous microsphere prepared by this method.

The method for preparing the porous microsphere of the invention includes the following. A copolymer is dissolved in an organic solvent and inorganic particles are dispersed in the organic solvent to form a mixed suspension. An aqueous solution containing a surfactant is provided. The mixed suspension is emulsified in the aqueous solution to obtain an emulsion. The emulsion is heated to remove the organic solvent therefrom and obtain inorganic-composite porous microsphere. The number-average molecular weight of the copolymer is less than 120,000 g/mol. The copolymer has a chemical structure shown in formula (1) or formula (2) below:

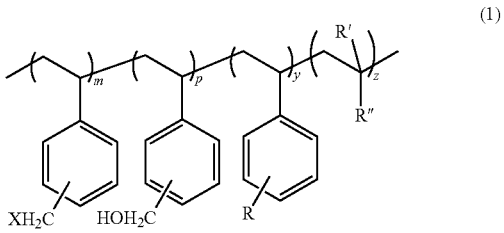

in formula (1),
m>0, 8%≤p≤80%, y≥0, and z≥0,
X is selected from chlorine, bromine and iodine, and
R is selected from hydrogen, chlorine, bromine, $-C_nH_{2n+1}$, $-CH_2NH_2$, $-CH_2C(=O)OC_iH_{2i+1}$, $-CH_2OC(=O)CH_{2n+1}$, $-NH_2$, $-N(C_iH_{2i+1})C(=O)C_nH_{2n+1}$, $-C(=O)OC_iH_{2i+1}$, $-OC(=O)C_nH_{2n+1}$, $-SO_3M$ (M is selected from hydrogen, sodium, potassium and $NH_4$) and $Si(OC_nH_{2n+1})_3$; R' is selected from hydrogen, carboxyl and $-C_nH_{2n+1}$, and R" is selected from hydrogen, $-C(=O)OC_jH_{2j+1}$, $-OC(=O)C_kH_{2k+1}$, $-C\equiv N$, $-Si(OC_nH_{2n+1})_3$, $-NH_2$, $-N(C_iH_{2i+1})C(=O)C_nH_{2n+1}$, pyrrolidonyl, and pyridinyl, wherein n=1 to 4, i=0 to 4, j=1 to 12, and k=1 to 17;

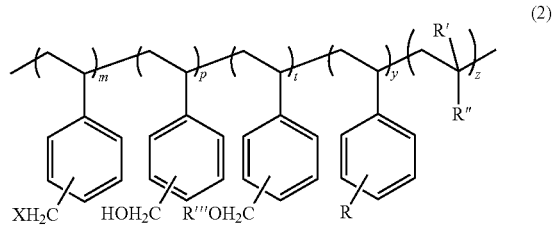

in formula (2),
m>0, 8%≤p≤80%, t>0, y≥0, and z≥0,
X is selected from chlorine, bromine and iodine, and
R is selected from hydrogen, chlorine, bromine, $-C_nH_{2n+1}$, $-CH_2NH_2$, $-CH_2C(=O)OC_iH_{2i+1}$, $-CH_2OC(=O)C_nH_{2n+1}$, $-NH_2$, $-N(C_iH_{2i+1})C(=O)C_nH_{2n+1}$, $-C(=O)OC_iH_{2i+1}$, $-OC(=O)C_nH_{2n+1}$, $-SO_3M$ (M is selected from hydrogen, sodium, potassium and $NH_4$) and $Si(OC_nH_{2n+1})_3$; R' is selected from hydrogen, carboxyl, and $-C_nH_{2n+1}$; R" is selected from hydrogen, $-C(=O)OC_jH_{2j+1}$, $-OC(=O)C_kH_{2k+1}$, $-C\equiv N$, $-Si(OC_nH_{2n+1})_3$, $-NH_2$, $-N(C_iH_{2i+1})C(=O)C_nH_{2n+1}$, pyrrolidonyl, and pyridinyl, and R''' is $-C_nH_{2n+1}$, wherein n=1 to 4, i=0 to 4, j=1 to 12, and k=1 to 17.

In an embodiment of the invention, the preparation method further includes: immersing the obtained inorganic-composite porous microsphere in an organic solvent, and/or adjusting the relative amounts of the inorganic particles, the surfactant and the solvent, so as to adjust the pore size of the inorganic-composite porous microsphere.

In an embodiment of the invention, the inorganic particles comprise at least one type of particles selected from the group consisting of titanium dioxide particles, silicon dioxide particles, magnetic substance particles, hydroxyapatite particles, heat-resistant substance particles, noble metal particles, and electrode active substance particles (such as lithium iron phosphate particles and silicon particles used in electrodes of lithium ion batteries).

In an embodiment of the invention, the preparation method further includes carbonizing or removing the copolymer to obtain a (composite) porous microsphere having an inorganic skeleton. "Composite" here refers to the combination of carbon and inorganic particles.

The porous microsphere of the invention includes one of the above copolymers or carbon that forms the skeleton of the porous microsphere, and inorganic particles located on the skeleton, or the inorganic particles are directly packed to form the skeleton. The diameter of the microsphere is 2 nm or more, and the average particle size of the inorganic particles is one-tenth or less of the size of the porous microsphere. In particular, the inorganic particles comprise, for instance, at least one type of the above inorganic particles.

Based on the above, in the invention, only a single process is needed to combine an organic material and an inorganic material to form porous microspheres, and the pore size and the functional inorganic particles embedded in the pore wall can be changed in response to various requirements.

When titanium dioxide particles are combined in the inorganic-composite porous microsphere of the invention, due to the macroporous structure and high surface area thereof, the inorganic-composite porous microsphere can significantly increase the efficiency when used as a material for a photocatalyst or a dye-sensitized solar cell, and can contribute greatly to both green energy and environmental protection. Moreover, when the skeleton of the porous microsphere is carbon, the carbon layer on the titanium dioxide particle surface allows the porous microsphere to display good photocatalytic effect even in visible light. If used in a DSSC, the special pore structure can greatly increase the light utilization efficiency and improve the adsorption of the dye, and the carbon layer on the $TiO_2$ particle surface can increase the conductivity, such that the photoelectric conversion efficiency is increased.

In order to make the aforementioned features and advantages of the disclosure more comprehensible, embodiments accompanied with figures are described in detail below.

DESCRIPTION OF THE EMBODIMENTS

Figure 1:
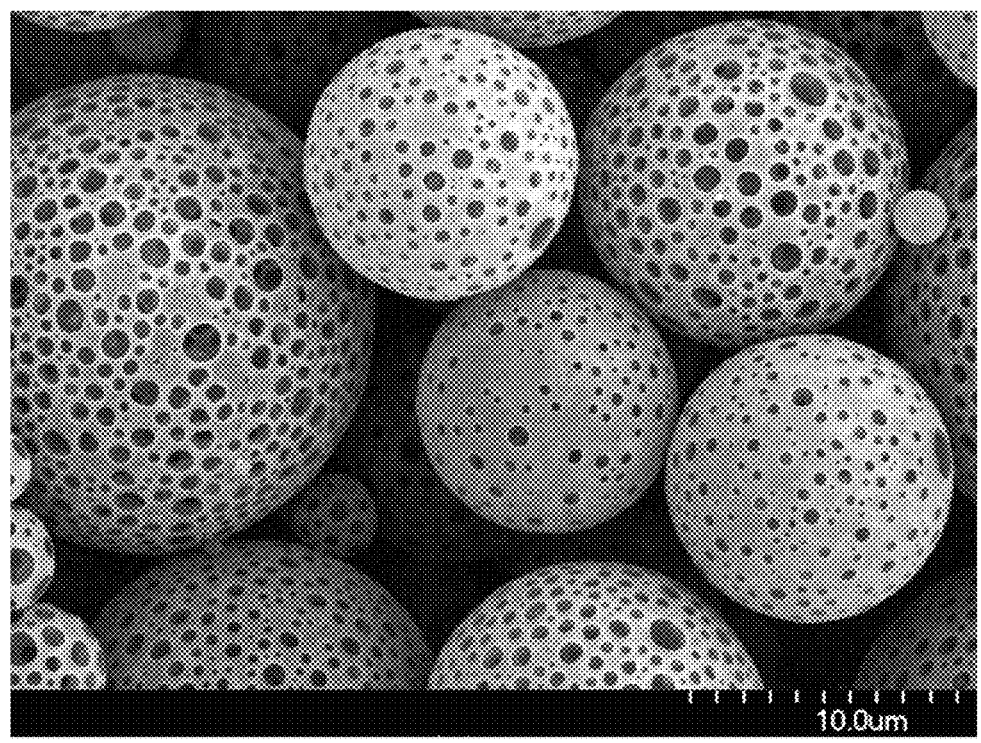
FIG. 1 is an electron microscope (EM) image of the titanium dioxide-composite porous microspheres obtained in Example 1 of the invention, wherein the inorganic-composite porous microspheres had megapores.

The first stage of the method for preparing inorganic-composite porous microspheres of the invention includes dissolving a special copolymer in an organic solvent and dispersing inorganic particles in the organic solvent to form a mixed suspension, and providing an aqueous solution containing a surfactant.

The copolymer used in the invention has the chemical structure shown in formula (1) or formula (2) below:

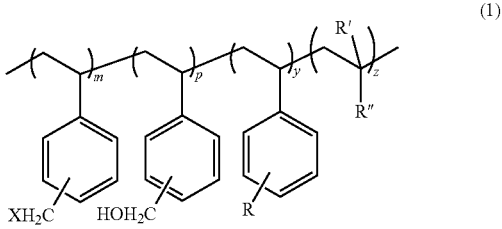

(1)

in formula (1), m>0, 8%≤p≤80%, y≥0, and z≥0,

X is selected from chlorine, bromine and iodine, and

R is selected from hydrogen, chlorine, bromine, —$CH_{2n+1}$, —$CH_2NH_2$, —$CH_2C(\!=\!O)OC_iH_{2i+1}$, —$CH_2OC(\!=\!O)C_nH_{2n+1}$, —$NH_2$, —$N(C_iH_{2i+1})C(\!=\!O)C_nH_{2n+1}$, —$C(\!=\!O)OC_iH_{2i+1}$, —$OC(\!=\!O)C_nH_{2n+1}$, —$SO_3M$ (M is selected from hydrogen, sodium, potassium and $NH_4$), and $Si(OC_nH_{2n+1})_3$; R' is selected from hydrogen, carboxyl and —$C_nH_{2n+1}$, and R" is selected from hydrogen, —$C(\!=\!O)OC_jH_{2j+1}$, —$OC(\!=\!O)C_kH_{2k+1}$, —$C\!\equiv\!N$, —$Si(OC_nH_{2n+1})_3$, —$NH_2$, —$N(C_iH_{2i+1})C(\!=\!O)C_nH_{2n+1}$, pyrrolidonyl, and pyridinyl, wherein n=1 to 4, i=0 to 4, j=1 to 12, and k=1 to 17;

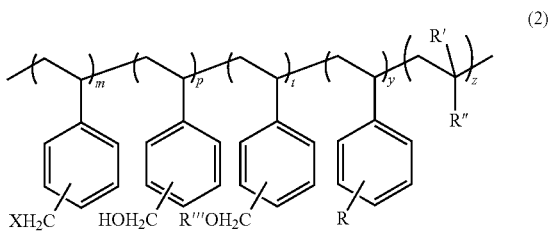

(2)

in formula (2), $m>0$, $8\% \leq p \leq 80\%$, $t>0$, $y \geq 0$, and $z \geq 0$, X is selected from chlorine, bromine and iodine, and R is selected from hydrogen, chlorine, bromine, $-C_nH_{2n+1}$, $-CH_2NH_2$, $-CH_2C(=O)OC_iH_{2i+1}$, $-CH_2OC(=O)C_nH_{2n+1}$, $-NH_2$, $-N(C_iH_{2i+1})C(=O)C_nH_{2n+1}$, $-C(=O)OC_iH_{2i+1}$, $-OC(=O)C_nH_{2n+1}$, $-SO_3M$ (M is selected from hydrogen, sodium, potassium and $NH_4$) and $Si(OC_nH_{2n+1})_3$, R' is selected from hydrogen, carboxyl and $-C_nH_{2n+1}$; R" is selected from hydrogen, $-C(=O)OC_jH_{2j+1}$, $-OC(=O)C_kH_{2k+1}$, $-C\equiv N$, $-Si(OC_nH_{2n+1})_3$, $-NH_2$, $-N(C_iH_{2i+1})C(=O)C_nH_{2n+1}$, pyrrolidonyl, and pyridinyl, and R''' is $-C_nH_{2n+1}$, wherein $n=1$ to 4, $i=0$ to 4, $j=1$ to 12, and $k=1$ to 17.

The number-average molecular weight of any above copolymer is 120,000 g/mol or less, preferably between 10,000 g/mol and 120,000 g/mol. In emulsification, the copolymer can carry fine water droplets into the oil droplets (droplets of the organic solvent) via the hydrophilicity of the vinylbenzyl alcohol units therein, so that a porous structure can be obtained. Therefore, if the inorganic particles are first dispersed in the organic solvent such that the inorganic particles are dispersed in the oil droplets during emulsification, then the inorganic particles can be combined with the copolymer forming the skeleton of the porous structure. After such a copolymer is carbonized, the inorganic particles are combined with carbon forming the porous structure skeleton.

When the proportion p of the vinylbenzyl alcohol unit in the copolymer satisfies $15\% \leq p \leq 65\%$, the diameter of the porous structures can be more uniform.

Moreover, the number-average molecular weight of the copolymer can be 55,000 g/mol or less, preferably between 20,000 g/mol and 55,000 g/mol, so as to expand the selection range of the organic solvent that can dissolve the copolymer.

The method for synthesizing the copolymer includes the following steps, for example. First, a water-soluble polymerization initiator and an aqueous solvent are mixed to form a starting solution, wherein the aqueous solution is water or a mixture of water and a first organic solvent (such as ethanol). The water-soluble polymerization initiator is, for instance: 2,2'-azobis(2-methylpropionamidine) dihydrochloride or 4,4'-azobis(4-cyanovaleric acid). Next, a monomer is added in the starting solution to form a mixture, wherein the monomer at least contains a vinylbenzyl halide, and can further contain a compound corresponding to the repeating unit containing R (such as styrene), a compound corresponding to the repeating unit containing R' and R" (such as methyl methacrylate), or a combination of the two, but is not limited thereto. Next, polymerization is caused in the mixture, and then the product is precipitated from the post-polymerization mixture in a second organic solvent (such as methanol or other alcohols). The product can be dissolved in another solvent (such as toluene) and then be precipitated again in the second organic solvent. A product with higher purity can be obtained by repeating this process several times.

In the above synthesis method, the water in the aqueous solvent results in hydrolysis of the vinylbenzyl halide to produce vinylbenzyl alcohol, such that the polymer contains a vinylbenzyl alcohol unit. When the aqueous solvent contains an alcohol having a structure of $C_nH_{2n+1}OH$ (n=1 to 4) as the first organic solvent, the vinylbenzyl halide is also alcoholyzed to produce a vinylbenzyl ether, such that the polymer also contains a vinylbenzyl ether unit.

In the step of dissolving the copolymer in the organic solvent and dispersing the inorganic particles in the organic solvent, the organic solvent used can be selected from a variety of organic solvents that can dissolve the copolymer but are immiscible with water, such as medium or low polarity organic solvents, such as benzene, toluene, xylene, dichloromethane, and chloroform.

The inorganic particles can include at least one kind of particles selected from the group consisting of titanium dioxide particles, magnetic substance particles, hydroxyapatite particles, heat-resistant substance particles, noble metal particles, and electrode active substance particles. As a result, the inorganic-composite porous microsphere of the invention can be applied in, for example, a photocatalyst, a DSSC, an artificial bone material, magnetic hyperthermia therapy, a heat insulation material, a catalyst, and a battery. Specifically, $TiO_2$ particles can be used for photocatalysts, in which magnetic substance particles (such as $Fe_3O_4$ particles) can be used in combination. $TiO_2$ particles can also be used for DSSC. Hydroxyapatite particles can be used for an artificial bone material. Magnetic substance particles (such as $Fe_3O_4$ particles) can be used for magnetic hyperthermia therapy. Heat-resistant substance particles, such as $ZrO_2$ particles, can be sued for a heat insulation material. Noble metal particles can be used for the catalyst. Electrode active substance particles, such as particles of lithium ion active substance (such as Si, $LiFePO_4$ or $LiCoO_2$) are used for battery electrodes.

Moreover, the particle size of the inorganic particles can be a maximum of one-tenth the size of the porous microsphere formed.

Moreover, if required, the inorganic particles can be dispersed in the organic solvent after a hydrophobic treatment is performed to the surfaces thereof, so that the inorganic particles are dispersed more uniformly.

In the step of providing the aqueous solution containing the surfactant, the surfactant used is not particularly limited, and can be an anionic surfactant, a cationic surfactant, an amphoteric surfactant, or a non-ionic surfactant.

After the mixed solution is formed and the aqueous solution containing the surfactant is provided, the mixed solution is emulsified in the aqueous solution to obtain an emulsion. The ratio of the mixed solution to the aqueous solution can be 1/100 to 1/2, and preferably 1/40 to 1/5. The emulsification can be done with, e.g., ultrasonic oscillation, a high-speed homogenizer, an emulsifier, or a microfluidic channel system, but is not limited thereto. The temperature of the emulsification can range from room temperature to any temperature lower than the boiling point of the solvent, and lower temperature results in longer volatilization time. The duration of the emulsification is generally 5 minutes to 15 minutes.

Next, heating is performed to remove the organic solvent from the emulsion to obtain inorganic-composite porous microspheres having a copolymer skeleton.

In the above preparation process, the pore distribution and the pore size of the microspheres can be adjusted by changing process parameters (such as the proportions of the polymer, the solvent, the surfactant and the inorganic particles). For instance, if the proportion of the polymer is increased, the pore morphology tends to be rounder and larger. If the proportion of the inorganic particles is increased, the pore morphology tends to be more irregular and smaller and densely distributed.

After the inorganic-composite porous microsphere having a polymer skeleton is obtained, a heat treatment can be performed in an inert atmosphere to carbonize the copolymer to obtain an inorganic-composite porous microsphere having a carbon skeleton. If the heat treatment is performed in an oxygen atmosphere, then a porous microsphere having an inorganic material as the skeleton can be obtained. Many applications exist for inorganic particles for which carbon is present on the surface. For instance, when a carbon layer is located on the titanium dioxide particle surface, good photocatalytic effect can be displayed even in visible light, and the conductivity thereof can also be increased, such that the photoelectric conversion efficiency of the DSSC is increased. When titanium dioxide particles are present in the carbon skeleton inorganic-composite porous microsphere of the invention, in a DSSC application, the pore structure of the microsphere can greatly increase the light utilization efficiency and improve the adsorption of the dye, such that the photoelectric conversion efficiency of the battery can be further increased.

The copolymer skeleton inorganic-composite porous microsphere of the invention has the special copolymer above, and can have a diameter ranging from mesopores to megapores. The copolymer in the copolymer-skeleton inorganic-composite porous microsphere of the invention having a pore size of 2 nm or larger can be carbonized or removed to obtain the inorganic porous microsphere having mesopores, macropores or megapores of 2 nm or larger that is first provided in the invention, wherein the particle size of the inorganic particles is one-tenth or less of the size of the formed inorganic porous microsphere.

EXAMPLES

I. Preparation for Copolymer-Skeleton Inorganic-Composite Porous Microsphere

Example 1: Preparation for Megaporous Copolymer-Skeleton Titanium Dioxide-Composite Porous Microspheres 0.05 g of the initiator 2,2'-azobis(2-methylpropionamidine) dihydrochloride (97%, Sigma-Aldrich, Saint Louis, USA), 30 mL of water, and 20 mL of ethanol (95%, Echo, Toufen, Taiwan) were mixed in a 100 mL single-neck flask, and then two monomers were added, which were respectively 2.5 mL of 4-vinylbenzyl chloride (90%, Acros, N.J., USA) and 5 mL of styrene (99.5%, Showa, Tokyo, Japan). The flask opening was sealed, a needle was inserted to introduce nitrogen continuously for 20 minutes, and then the flask opening was sealed again. The sealed single-neck flask was placed in an oil vessel for an oil bath. During the reaction, the temperature of the oil bath was kept at 75° C., and stirring was continuously performed using a magnet for 16 hours. After 16 hours, the flask was removed from the oil vessel, and after being cooled to room temperature, the flask was opened, and the polymer solution thereof was added dropwise in a beaker containing methanol (99.8%, Grand, Pathum Thani, Thailand) to precipitate. Next, a polymer solid powder was obtained from the product in the beaker via a suction filtration separation method. Lastly, the polymer solid powder was placed in a vacuum oven to remove residual moisture to obtain Copolymer 1 of the following structure:

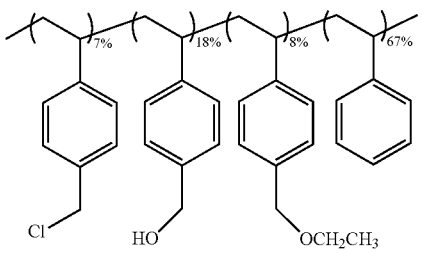

0.01 g of TiO$_2$ and 0.1 g of Copolymer 1 were added together in 1.2 g of toluene. In addition, 40 mL of aqueous solution containing 0.3 wt % of sodium dodecyl sulfate (SDS; 99%, Acros, N.J., USA) was prepared. The solution in which the copolymer was dissolved was poured in the SDS aqueous solution, and emulsification was performed using a mechanical emulsifier at a rate of 3300 rpm for 5 minutes. After 5 minutes, stirring was continued using a magnet and heating was performed at the same time to increase the temperature to 55° C. After about 1 hour when toluene was gradually volatilized and the polymer therein was solidified, micron porous composite microspheres were obtained.

FIG. 1 is an electron microscope image of the titanium dioxide-composite porous microspheres obtained above.

Example 2: Preparation for Macroporous Copolymer-Skeleton Titanium Dioxide-Composite Porous Microspheres 0.15 g of TiO$_2$ and 0.1 g of Copolymer 1 were added together in 1.2 g of toluene. In addition, 40 mL of aqueous solution containing 1 wt % of sodium dodecyl sulfate (SDS; 99%, Acros, N.J., USA) was prepared. The solution in which the copolymer was dissolved was poured in the SDS aqueous solution, and emulsification was performed using an emulsifier at a rate of 3300 rpm for 5 minutes. After 5 minutes, stirring was continued using a magnet and heating was performed at the same time to increase the temperature to 55° C. After about 1 hour when toluene was gradually volatilized and the polymer therein was solidified, micron porous composite microspheres were obtained.

Figure 2:
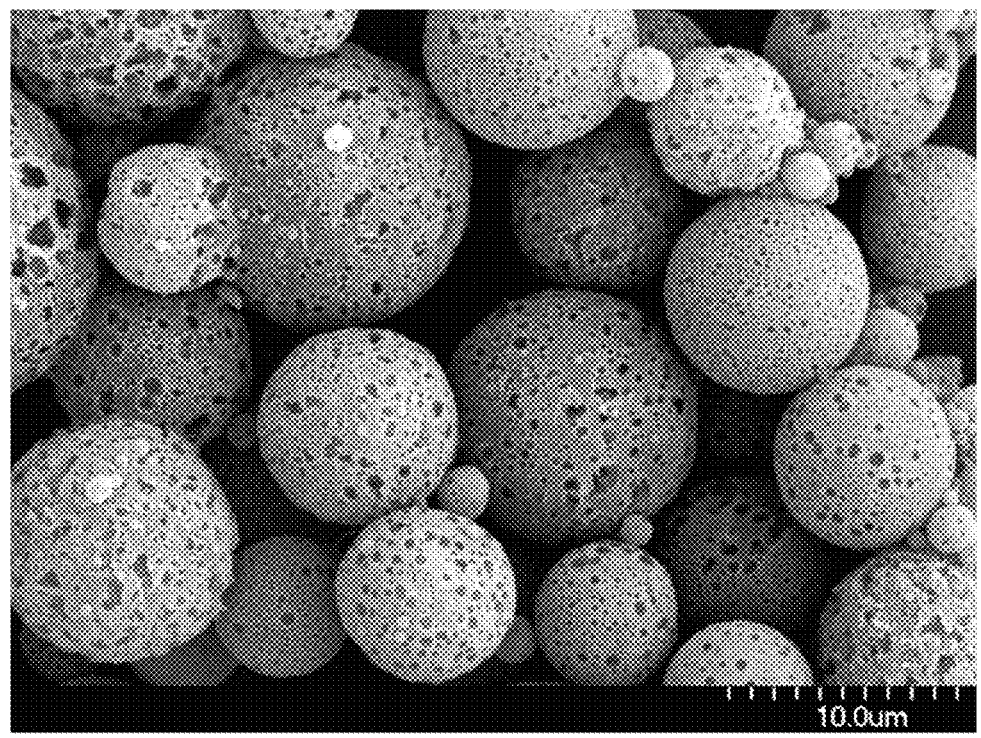
FIG. 2 is an EM image of the titanium dioxide-composite porous microspheres obtained in Example 2 of the invention, wherein the inorganic-composite porous microspheres had macropores.

FIG. 2 is an electron microscope image of the titanium dioxide-composite porous microspheres obtained above. It can be known from the comparison with Example 1 that the pore morphology is different, and the pore size is smaller than that of the product of Example 1.

Example 3: Preparation for Megaporous Copolymer-Skeleton Zirconium Dioxide-Composite Porous Microspheres 0.25 g of ZrO$_2$ and 0.1 g of Copolymer 1 were added together in 1.2 g of toluene. In addition, 40 mL of aqueous solution containing 1 wt % of sodium dodecyl sulfate (SDS; 99%, Acros, N.J., USA) was prepared. The solution in which the copolymer was dissolved was poured in the SDS aqueous solution, and emulsification was performed using an emulsifier at a rate of 3300 rpm for 5 minutes. After 5 minutes, stirring was continued using a magnet and heating was performed at the same time to increase the temperature to 55° C. After about 1 hour when toluene was gradually volatilized and the polymer therein was solidified, micron porous composite microspheres were obtained.

Figure 3:
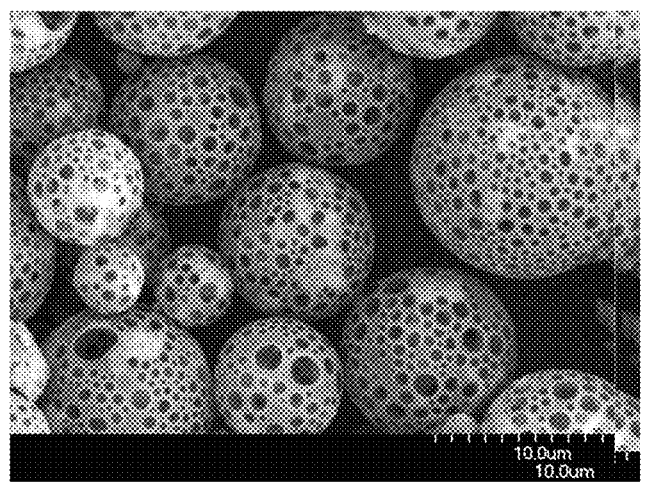
FIG. 3 is an EM image of the zirconium dioxide-composite porous microspheres obtained in Example 3 of the invention, wherein the inorganic-composite porous microspheres had megapores.

FIG. 3 is an electron microscope image of the megaporous copolymer-skeleton zirconium dioxide-composite porous microspheres of this example.

Example 4: Preparation for Megaporous Copolymer-Skeleton Zeolite-Composite Porous Microspheres First, 0.05 g of zeolite and 0.05 g of silane (90%, Sigma-Aldrich, USA) were added together in toluene and heated to 110° C. to perform surface modification, then the surface-modified zeolite was removed from the toluene via suction filtering, and then 0.05 g of the silane surface-modified zeolite and 0.05 g of Copolymer 1 were added together in 1.3 g of toluene. In addition, a 40 mL aqueous solution containing 5 wt % of sodium dodecyl sulfate (SDS; 99%, Acros, N.J., USA) was prepared. The solution in which the copolymer was dissolved was poured in the SDS aqueous solution, and emulsification was performed using an emulsifier at a rate of 8000 rpm for 5 minutes. After 5 minutes, stirring was continued using a magnet and heating was performed at the same time to increase the temperature to 55° C. After about 1 hour when toluene was gradually volatilized and the polymer therein was solidified, micron porous composite microspheres were obtained.

Figure 4:
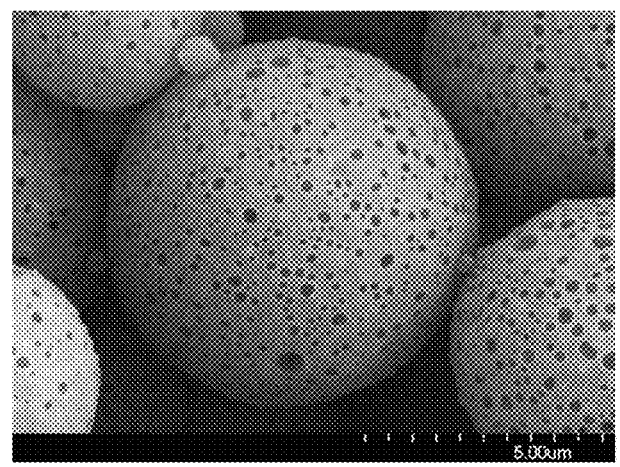
FIG. 4 is an EM image of the zeolite-composite porous microspheres obtained in Example 4 of the invention, wherein the inorganic-composite porous microspheres had megapores.

FIG. 4 is an electron microscope image of the megaporous copolymer-skeleton zeolite-composite porous microspheres of this example.

Example 5: Preparation for Macroporous Copolymer-Skeleton Nano-Silicon-Composite Porous Microspheres 0.1 g of silicon powder (average particle size of about 100 nm) and 0.1 g of silane (90%, Sigma-Aldrich, USA) were added together in toluene and heated to 110° C. to perform surface modification, then surface-modified silicon powder was removed from the toluene via suction filtering, and then 0.1 g of the silane surface-modified silicon powder and Copolymer 1 were added together in 1.3 g of toluene. In addition, a 40 mL aqueous solution containing 5 wt % of sodium dodecyl sulfate (SDS; 99%, Acros, N.J., USA) was prepared. The solution in which the copolymer was dissolved was poured in the SDS aqueous solution, and emulsification was performed using an emulsifier at a rate of 8000 rpm for 5 minutes. After 5 minutes, stirring was continued using a magnet and heating was performed at the same time to increase the temperature to 65° C. After about 1 hr when toluene was gradually volatilized and the polymer therein was solidified, micron porous composite microspheres were obtained.

Figure 5:
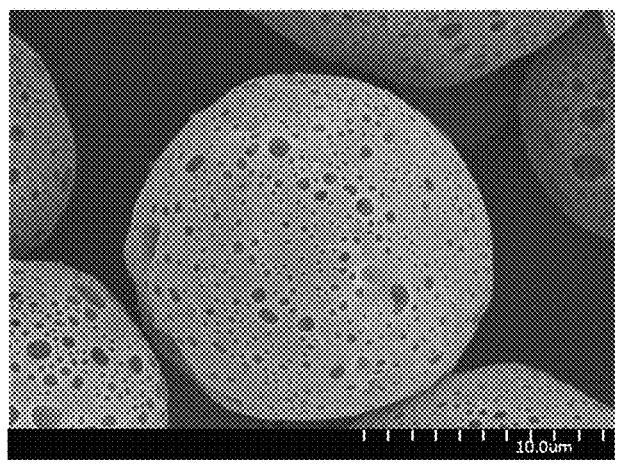
FIG. 5 is an EM image of the nano-silicon (having an average particle size of 100 nm) composite porous microspheres obtained in Example 5 of the invention, wherein the porous microspheres had megapores.

FIG. 5 is an electron microscope image of the megaporous copolymer-skeleton nano-silicon-composite porous microsphere of the present example.

Example 6: Preparation for Megaporous Copolymer-Skeleton Micron-Silicon-Composite Porous Microspheres 0.05 g of silicon powder (average particle size of about 1 rpm) and 0.05 g of Copolymer 1 were added together in 1.2 g of toluene. In addition, 40 mL of aqueous solution containing 0.3 wt % of sodium dodecyl sulfate (SDS; 99%, Acros, N.J., USA) was prepared. The solution in which the copolymer was dissolved was poured in the SDS aqueous solution, and emulsification was performed using an emulsifier at a rate of 3300 rpm for 15 minutes. After 5 minutes, stirring was continued using a magnet and heating was performed at the same time to increase the temperature to 55° C. After about 1 hour when toluene was gradually volatilized and the polymer therein was solidified, micron porous composite microspheres were obtained.

Figure 6:
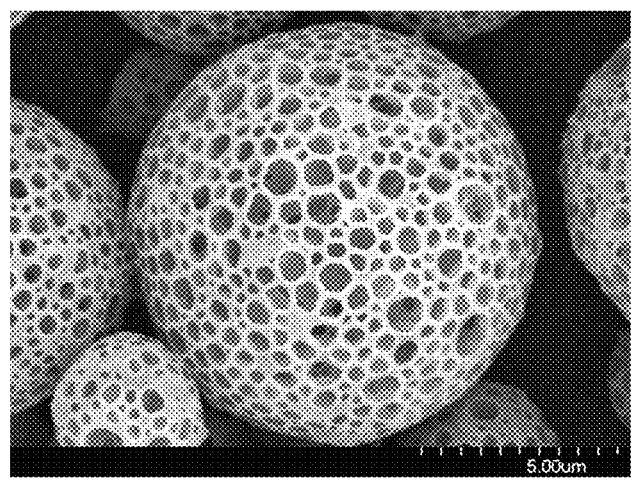
FIG. 6 is an EM image of the micron-silicon (having an average particle size of 0.5 to 1 μm) composite porous microspheres obtained in Example 6 of the invention, wherein the porous microspheres had megapores.

FIG. 6 is an electron microscope image of the megaporous copolymer-skeleton micron-silicon-composite porous microspheres of this example. It can be known from the comparison with Example 5 that the pore morphology is different, and the pore size is remarkably greater.

II. Preparation for Carbon-Skeleton Inorganic-Composite Porous Microspheres

Example 7

The copolymer in the $TiO_2$-polymer composite porous microspheres obtained in Example 2 was carbonized to obtain the $TiO_2$-carbon composite porous microspheres of Example 7. The carbonization was performed in a nitrogen or argon atmosphere, and heating was performed from room temperature to 900° C. at a rate of 10° C./min.

Figure 7:
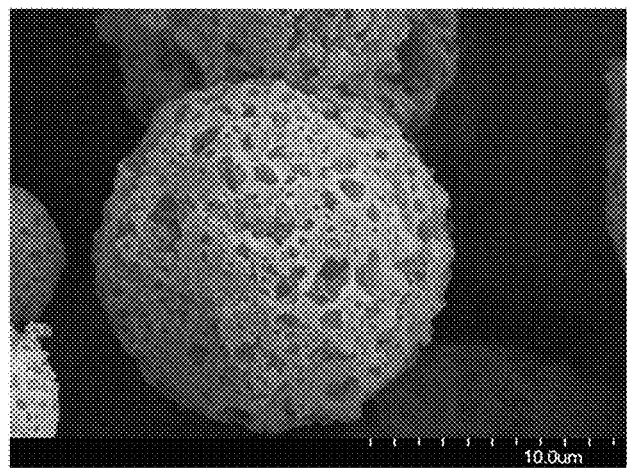
FIG. 7 is an EM image of the carbonized product of the titanium dioxide-composite porous microspheres obtained in Example 2 of the invention.

FIG. 7 is an electron microscope image of the $TiO_2$-composite porous carbon microspheres obtained above.

Example 8

The copolymer in the Si-polymer composite porous microspheres obtained in Example 5 was carbonized to obtain the Si-carbon composite porous microspheres of Example 8. The carbonization was performed in a nitrogen or argon atmosphere, and heating was performed from room temperature to 900° C. at a rate of 10° C./min.

Figure 8:
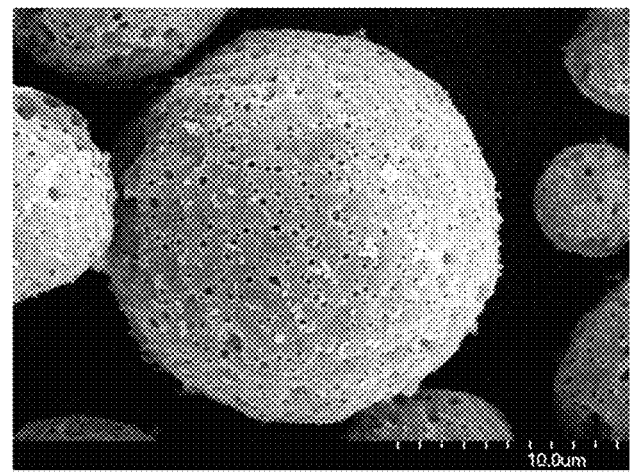
FIG. 8 is an EM image of the carbonized product of the nano-silicon-composite porous microspheres obtained in Example 5 of the invention.

FIG. 8 is an electron microscope image of the nano-silicon-composite porous carbon microspheres obtained above.

Example 9

The copolymer in the Si-polymer composite porous microspheres obtained in Example 6 was carbonized to obtain the Si-carbon composite porous microspheres of Example 9. The carbonization was performed in a nitrogen or argon atmosphere, and heating was performed from room temperature to 900° C. at a rate of 10° C./min.

Figure 9:
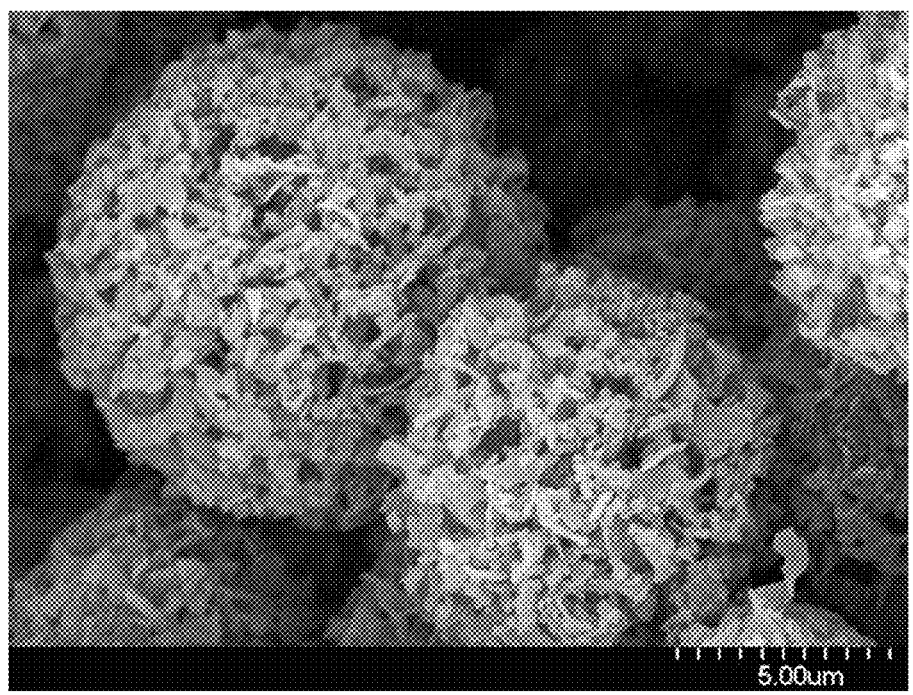
FIG. 9 is an EM image of the carbonized product of the micron-silicon-composite porous microspheres obtained in Example 6 of the invention.

FIG. 9 is an electron microscope image of the micron-silicon-composite porous carbon microspheres obtained above.

III. Preparation for Inorganic Particle-Skeleton Porous Microspheres

Example 10

A heat treatment was performed on the $TiO_2$-composite porous microspheres obtained in Example 2 in an oxygen atmosphere to remove the copolymer therein and obtain the inorganic particle-skeleton porous microspheres of Example 10. Conditions of the oxygen atmosphere and heat-treatment include: heating from room temperature to 900° C. at a heating rate of 10° C./min in air (or oxygen gas).

Figure 10:
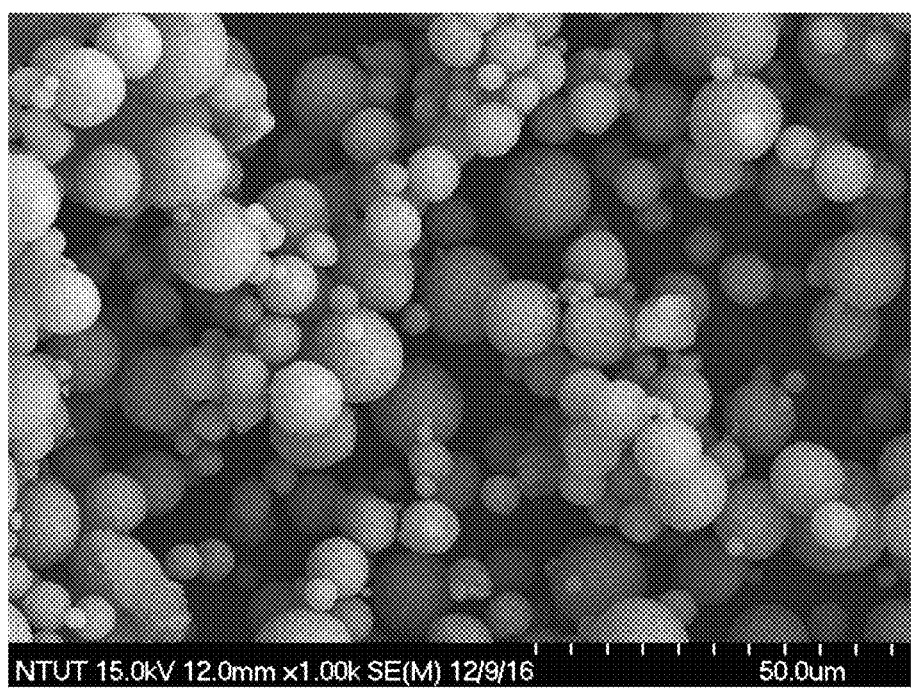
FIG. 10 is an EM image of the titanium dioxide porous microsphere (a type of porous microsphere with an inorganic particle skeleton) obtained in Example 10 of the invention.

FIG. 10 is an electron microscope image of the TiO$_2$-skeleton porous microspheres obtained above.

III. Application of Inorganic-Composite Porous Microspheres

Example 11

The TiO$_2$-carbon composite porous carbon microspheres obtained in Example 7 of the invention was placed in 100 mL of an aqueous solution containing 10 ppm of methylene blue, and a photodegradation reaction was performed via irradiation. The duration of irradiation was 2 hours, and a 36 W UV tube was used as the light source. A test was performed on a traditional nano-TiO$_2$ photocatalyst (P25, Degussa, Germany) with the same experimental conditions.

Figure 11:
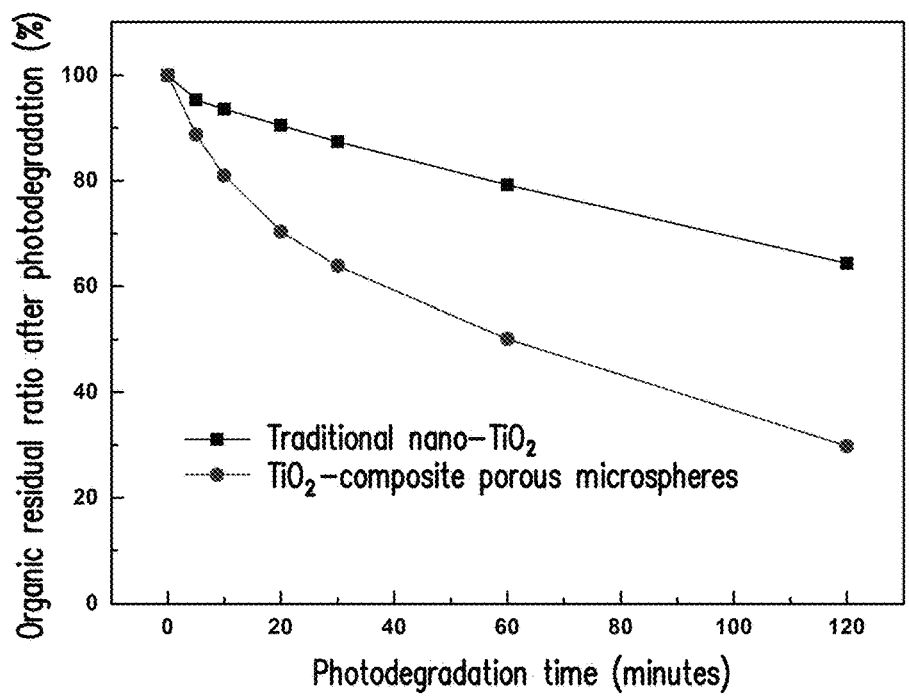
FIG. 11 shows the data of a photocatalyst using the carbonized product of the $TiO_2$-composite porous microspheres obtained in Example 2 of the invention, and the data of a traditional $TiO_2$ photocatalyst.

The test results are shown in FIG. 11. FIG. 11 shows that the photocatalytic effect of the TiO$_2$-composite porous carbon microspheres of the invention under UV is increased by about 50% compared to the photocatalytic effect of Degussa P25.

Example 12

The inorganic micron-Si porous carbon microspheres obtained in Example 9 of the invention was used to fabricate a lithium ion battery, and a charge/discharge test was performed. The fabrication of the battery included steps such as preparation of a slurry of micron-Si porous carbon microspheres, negative electrode plate coating, and battery packaging. The charge/discharge test included a fixed current of 0.1 C, and a upper limit of 2 V and a lower limit of 0.01 V for the charge/discharge voltage.

Figure 12:
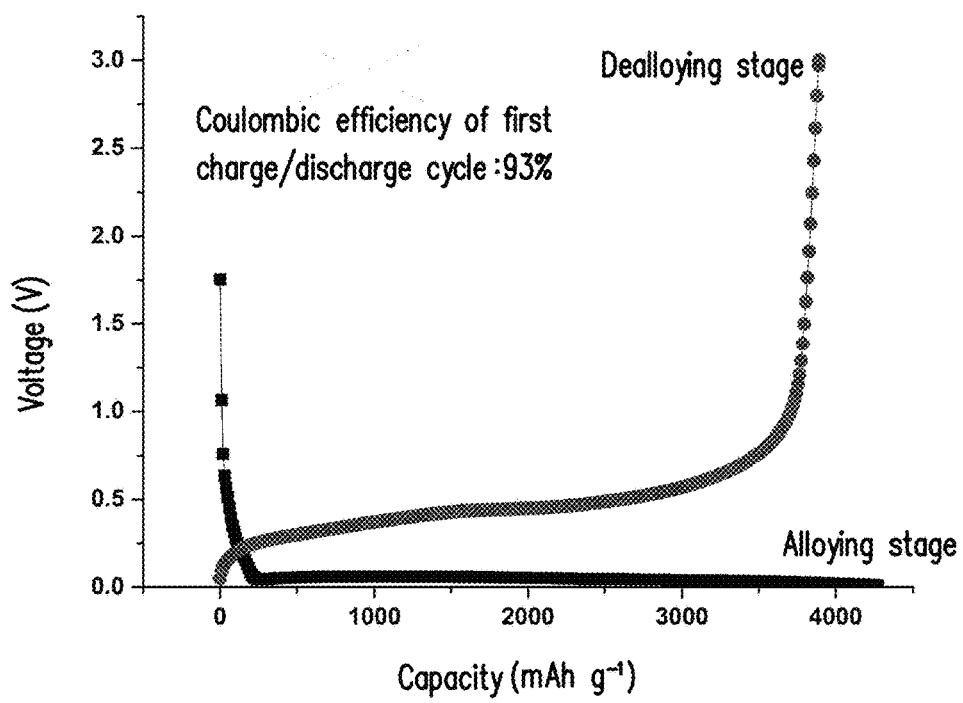
FIG. 12 shows the first charge/discharge curve and the coulombic efficiency of a lithium ion battery made using the carbonized product of the micron-silicon-composite porous microspheres obtained in Example 6 of the invention.

The application results are shown in FIG. 12. FIG. 12 shows that the structure can successfully improve the first coulombic efficiency of the silicon negative electrode, and the first coulombic efficiency thereof reached 93%. The irreversible capacity can be greatly improved compared to regular silicon powder.

Accordingly, in the invention, only a single process is needed to combine an organic material and an inorganic material to form a porous microsphere, and the pore size and functional inorganic particles embedded in the pore wall can be changed in response to various requirements.

Moreover, when the inorganic particles in the inorganic-composite porous microspheres of the invention are TiO$_2$ particles and the skeleton thereof is carbon, the carbon layer on the TiO$_2$ particle surface allows the porous microspheres to display good photocatalytic effect even in visible light.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method for preparing a porous microsphere, comprising:
   dissolving a copolymer in an organic solvent and dispersing inorganic particles in the organic solvent to form a mixed suspension;
   providing an aqueous solution containing a surfactant;
   emulsifying the mixed suspension in the aqueous solution to obtain an emulsion; and
   heating the emulsion to remove the organic solvent from the emulsion and obtain inorganic-composite porous microspheres,
   wherein a number-average molecular weight of the copolymer is less than 120,000 g/mol and the copolymer has a chemical structure shown in formula (1) or (2) below:

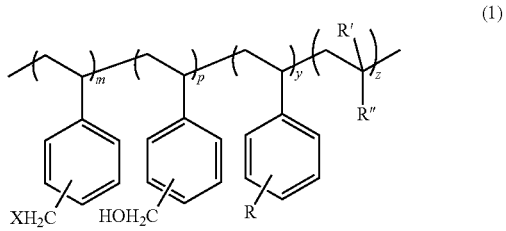

(1)

in formula (1),
m>0, 8%≤p≤80%, y≥0, and z≥0,
X is selected from chlorine, bromine and iodine, and
R is selected from hydrogen, chlorine, bromine, —C$_n$H$_{2n+1}$, —CH$_2$NH$_2$, —CH$_2$C(=O)OC$_i$H$_{2i+1}$, —CH$_2$OC(=O)C$_n$H$_{2n+1}$, —NH$_2$, —N(C$_i$H$_{2i+1}$)C(=O)C$_n$H$_{2n+1}$, —C(=O)OC$_i$H$_{2i+1}$, —OC(=O)C$_n$H$_{2n+1}$, —SO$_3$M (M is selected from hydrogen, sodium, potassium and NH$_4$) and Si(OC$_n$H$_{2n+1}$)$_3$, R' is selected from hydrogen, carboxyl and —C$_n$H$_{2n+1}$, and R" is selected from hydrogen, —C(=O)OC$_j$H$_{2j+1}$, —OC(=O)C$_k$H$_{2k+1}$, —C≡N, —Si(OC$_n$H$_{2n+1}$)$_3$, —NH$_2$, —N(C$_i$H$_{2i+1}$)C(=O)C$_n$H$_{2n+1}$, pyrrolidonyl and pyridinyl, wherein n=1 to 4, i=0 to 4, j=1 to 12, and k=1 to 17;

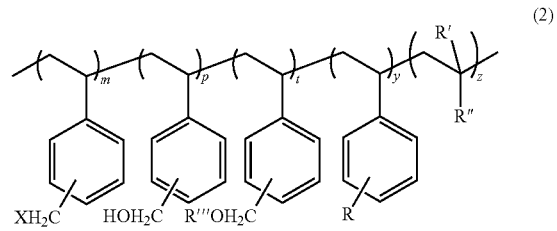

(2)

in formula (2),
m>0, 8%≤p≤80%, t>0, u≥0, and z≥0,
X is selected from chlorine, bromine and iodine, and
R is selected from hydrogen, chlorine, bromine, —C$_n$H$_{2n+1}$, —CH$_2$NH$_2$, —CH$_2$C(=O)OC$_i$H$_{2i+1}$, —CH$_2$OC(=O)C$_n$H$_{2n+1}$, —NH$_2$, —N(C$_i$H$_{2i+1}$)C(=O)C$_n$H$_{2n+1}$, —C(=O)OC$_i$H$_{2i+1}$, —OC(=O)C$_n$H$_{2n+1}$, —SO$_3$M (M is selected from hydrogen, sodium, potassium and NH$_4$) and Si(OC$_n$H$_{2n+1}$)$_3$, R' is selected from hydrogen, carboxyl and —C$_n$H$_{2n+1}$, R" is selected from hydrogen, —C(=O)OC$_j$H$_{2j+1}$, —OC(=O)C$_k$H$_{2k+1}$, —C≡N, —Si(OC$_n$H$_{2n+1}$)$_3$, —NH$_2$, —N(C$_i$H$_{2i+1}$)C(=O)C$_n$H$_{2n+1}$, pyrrolidonyl and pyridinyl, and R''' is —C$_n$H$_{2n+1}$, wherein n=1 to 4, i=0 to 4, j=1 to 12, and k=1 to 17.

2. The method of claim 1, further comprising: immersing the obtained inorganic-composite porous microspheres in the organic solvent, and/or adjusting a relative amount of the inorganic powder, the surfactant and the solvent to adjust a pore size of the inorganic-composite porous microspheres.

3. The method of claim 2, wherein the inorganic particles comprise at least one kind of particles selected from the group consisting of titanium dioxide particles, silicon dioxide particles, magnetic substance particles, hydroxyapatite particles, heat-resistant substance particles, noble metal particles, and electrode active substance particles.

4. The method for preparing the porous microsphere of claim 2, further comprising: carbonizing the copolymer or removing the copolymer.

5. The method of claim 1, wherein the inorganic particles comprise at least one kind of particles selected from the group consisting of titanium dioxide particles, silicon dioxide particles, magnetic substance particles, hydroxyapatite particles, heat-resistant substance particles, noble metal particles, and electrode active substance particles.

6. The method for preparing the porous microsphere of claim 1, further comprising: carbonizing the copolymer or removing the copolymer.

* * * * *